US006872582B2

(12) United States Patent
Pirkle et al.

(10) Patent No.: US 6,872,582 B2
(45) Date of Patent: Mar. 29, 2005

(54) SELECTIVE TRIM AND WAFER TESTING OF INTEGRATED CIRCUITS

(75) Inventors: Rex W. Pirkle, Denison, TX (US); Curtis L. Harbert, Sherman, TX (US); George Reeves, Sherman, TX (US)

(73) Assignee: Texas Instruments Incorporated, Dallas, TX (US)

(*) Notice: Subject to any disclaimer, the term of this patent is extended or adjusted under 35 U.S.C. 154(b) by 162 days.

(21) Appl. No.: 10/342,875

(22) Filed: Jan. 15, 2003

(65) Prior Publication Data

US 2003/0169064 A1 Sep. 11, 2003

Related U.S. Application Data

(60) Provisional application No. 60/361,336, filed on Mar. 5, 2002.

(51) Int. Cl.[7] ............................................. G01R 31/26
(52) U.S. Cl. ...................................... 438/14; 438/15
(58) Field of Search ............................. 438/14, 15, 17, 438/18

(56) References Cited

U.S. PATENT DOCUMENTS 6,472,897 B1 * 10/2002 Shyr et al. .................. 324/765

* cited by examiner

*Primary Examiner*—Tuan H. Nguyen
(74) *Attorney, Agent, or Firm*—W. James Brady, III; Frederick J. Telecky, Jr.

(57) ABSTRACT

A method of selective trim and wafer testing of precision integrated circuits is provided by determining if a sample die is within specification. If so the sample parameters are measured and if the die passes the sample parameters the die is good and repeat the steps of determining if the die is within specification and measuring the sample parameters until a die fails the measurement test or requires a trimming and if a die fails a measurement test or requires trimming perform 100 percent test and trim.

7 Claims, 3 Drawing Sheets

SELECTIVE TRIM AND WAFER TESTING OF INTEGRATED CIRCUITS

This amendment claims priority under 35 USC §119(e)(1) of provisional application No. 60/361,336, filed on Mar. 5, 2002.

FIELD OF INVENTION

This invention relates to precision trimmed integrated circuits, and more particularly to statistical based selective trim and wafer testing of precision trimmed integrated circuits.

BACKGROUND OF INVENTION

Integrated circuit designs that incorporate trim circuits to adjust critical parameters with high precision conventionally require 100 percent test and trim. This is an expensive and time-consuming process.

FIG. 1 illustrates a generic, conventional probe and trim test procedure typically used for a trim adjustable integrated circuit. Normally, such a device is measured prior to trimming, target values are calculated, and a trim routine is executed to adjust a specific parameter to a desired value on every die. Reviewing FIG. 1, a pre-trim measurement is made and then it is determined if the trim parameter is inside the trim capability. If not inside the trim capability the chip is deemed a failure and is sorted to the appropriate failure category. The system records this on the wafer map and then goes or indexes to the next chip. If measurements are within the trim capability then the trim routine is executed. After trim routine execution, the next step is to measure the next parameter and determine if the next parameter passes specification. If not the chip is sorted to a failure bin, the wafer map is updated, and the system moves to the next chip. This step is repeated until all successive parametric test specifications have been measured. If all specification requirements are met the chip is deemed good, the wafer map is updated accordingly, and the system having determined that all tests have been successfully completed proceeds to the next chip.

SUMMARY OF INVENTION

In accordance with one embodiment of the present invention a method of selective trim and wafer testing of precision trimmed integrated circuits includes the steps of determining if each sample die requires trimming or not, and steering a sampling routine between sample test and 100 percent test and trim.

In accordance with an embodiment the steering includes maintaining the test sequence in the sample test mode only until a trim or test failure occurs and if a trim or test failure occurs performing 100 percent test and trimming in a map sequence such that failures are traced along a boundary between passing and fail/trim devices.

DESCRIPTION OF PREFERRED EMBODIMENT OF THE PRESENT INVENTION

Figure 1:
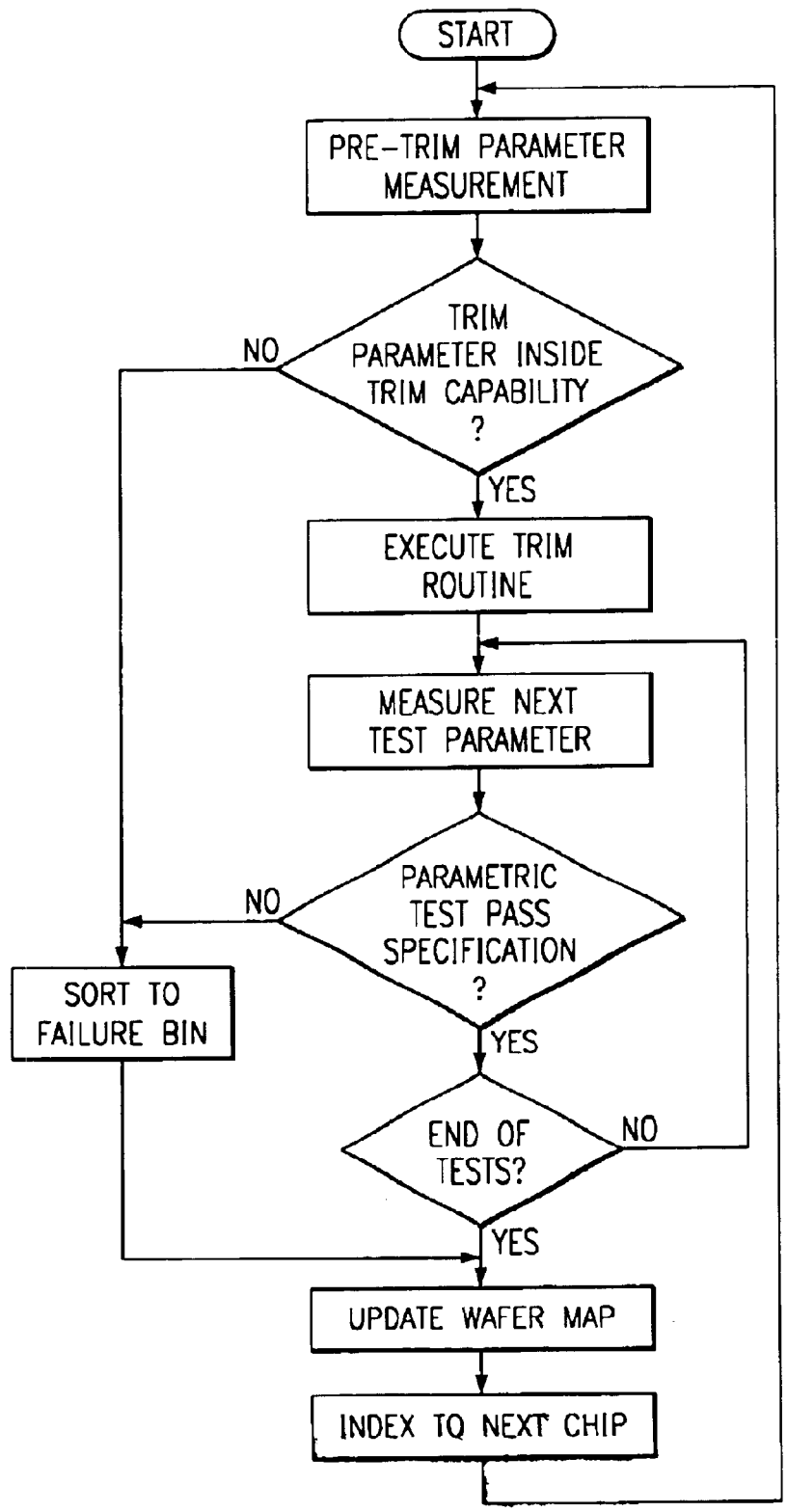
FIG. 1 is a flow chart of a generic, conventional probe and trim test procedure.
Figure 2:
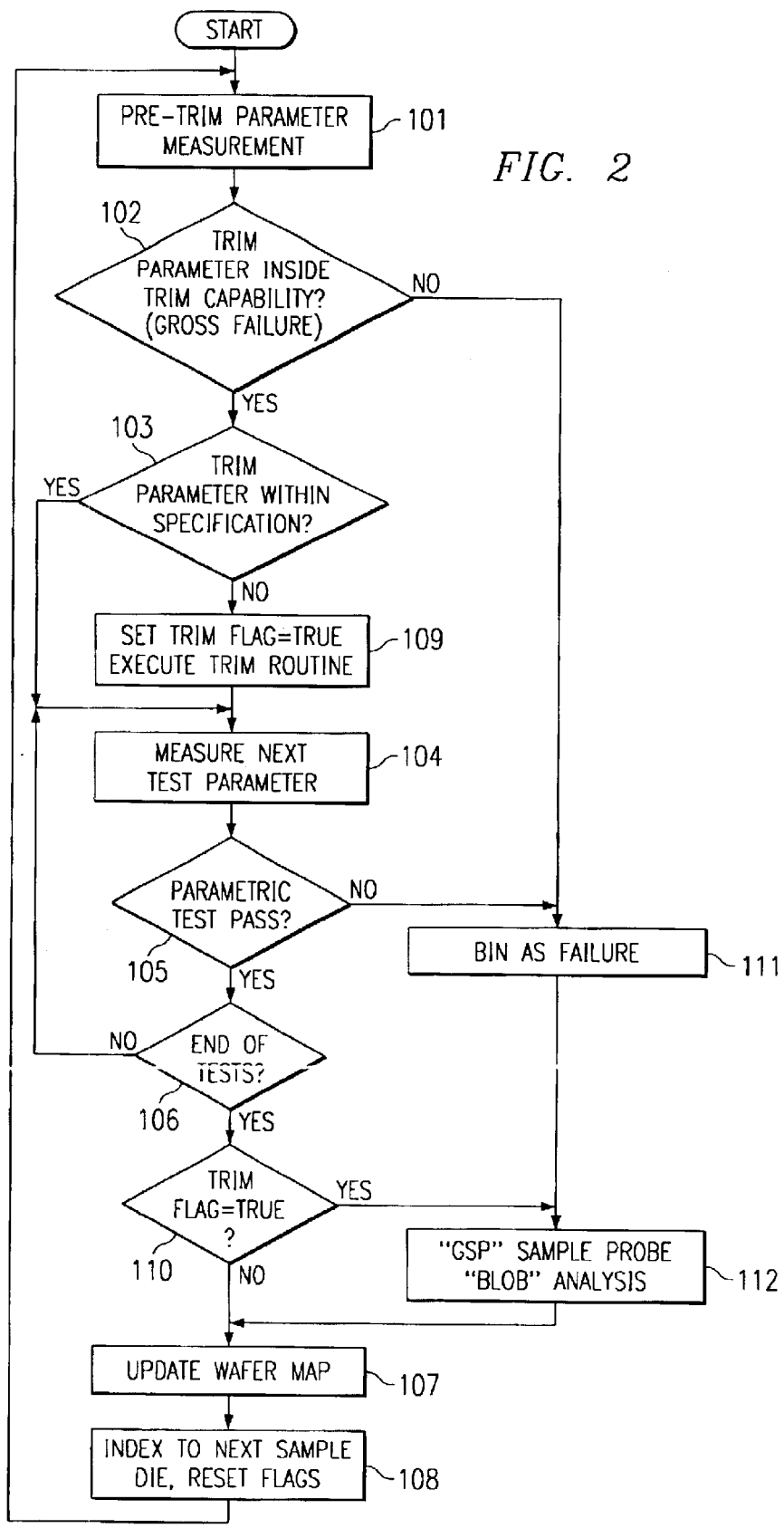
FIG. 2 is a flow chart of a process flow according to one embodiment of the present invention.

Referring to FIG. 2 there is illustrated the process flow according to one embodiment of the present invention. The first step 101 is a pre-trim parameter measurement. It is then at step 102 it is determined if the trim parameter is inside the trim capability. If not there is a gross failure and the die is binned as a failure. If it is within the trim capability at step 102, it then determines if the trim parameter is within the specification at step 103. For maximum efficiency, it is required that the mean value of the pre-trim distribution be nominally centered between the desired minimum and maximum test limits. The test process takes advantage of the natural distribution, and realizes that the majority of devices will lie near the center of the desired distribution and do not require trimming. If the trim parameter is within the trim specification, it processes to steps to measure the test parameters at steps 104, 105 and 106. The die undergoes the various tests until they are complete as indicated at step 106. If there has been no trim requirement the wafer map is updated at step 107, indicating a good die and the system indexes in step 108 to the next sample die.

Once initiated, the test sequence will remain in sampling mode until a device that requires trim or a failure is encountered. If that occurs, the program enters a recursive mode, 100 percent testing and trimming in a map sequence such that failures are traced along the boundary between passing, and fail/trimmed devices.

If the trim parameter is not within the trim specification at step 103, a trim flag is set to true and a trim process is operated at step 109 to trim the die before the measurements are made. After the trim process is complete, measurements are made at steps 104, 105 and 106. It is determined if the measurement passes the parametric test and if so the flag at 110 indicates the chip is good but requires going into the 100 percent test mode. Where there is determined a gross failure at step 102 or fails a measurement test at step 105 the failure is noted as a bin failure at 111 and the information with the trim flag information at 110 is sent to perform a GSP sample probe "blob" analysis at 112 to determine the fail/trim boundary The process will resume sampling mode when the fail/trim boundary is fully traced, and all good dies define the trace border.

The test flow considers the following possible circumstances:

Good die centered within specification, which requires no trimming (sample mode).
Good die, which requires trimming (100 percent test mode).
Bad die, which cannot be trimmed to specification (100 percent test mode).
Bad die, which fails some test condition other than trimmed parameter (100 percent test mode).

The test routine described allows sampling test methods to be applied to trimmed ICs that would otherwise require 100 percent trim and test. In the past, the sampling technique described has been restricted to those integrated circuits that do not incorporate trim circuits. By monitoring whether or not the sampled die required trim or not, and using this information to steer the GSP sampling routine between 100 percent and sample test, the sample probe method may be extended to include trimmed devices. The original sampling procedure used only pass/fail information.

Figure 3:
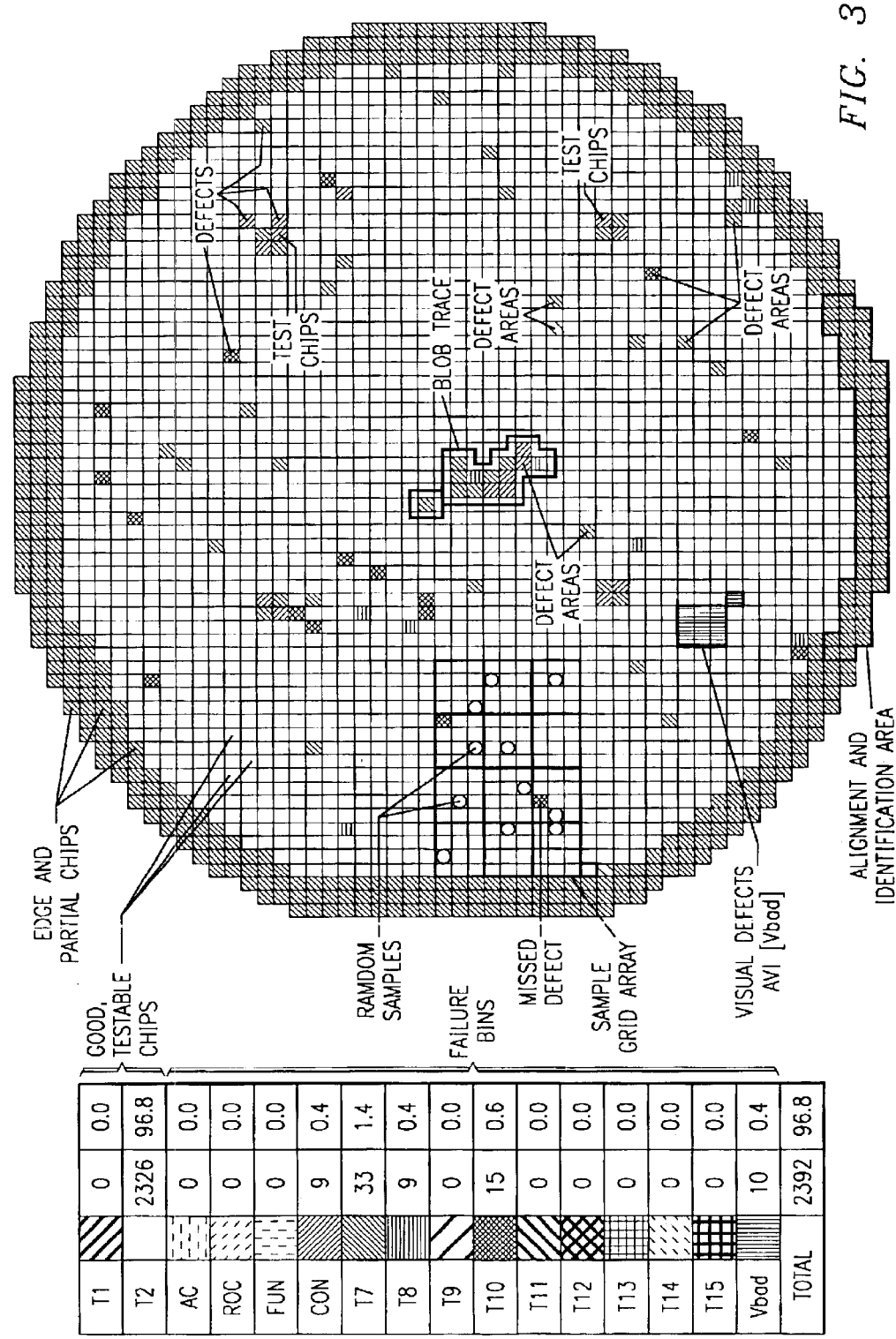
FIG. 3 illustrates the "Good Sample Probe" (GSP) wafer map.

The GSP (Good Sample Probe) is a prober control software program, which provides a chip testing sequence based on a statistical sampling method, and records a wafer map of test results for the chips on the wafer. GSP testing significantly reduces test time and equipment requirements in Wafer Fabs. The traditional sampling methods fall short in insuring all chips on the wafer fall within the statistical boundaries based on the sample. This significant possible variation is caused by the fact that "all" wafer processed in any subject lot have variation and possible defective chips on each wafer are necessarily evenly distributed. The sampling method uses additional features to the traditional statistical sampling method that complement and enhances the accuracy, said method being random sample selection from small cells within a predefined grid array. The GSP basis sequence is described in the following steps with reference to FIG. 3:

1. Based on the chip type, the wafer map is initialized. In this step, testable and non-testable areas of the wafer are defined. A partial edge die is non-testable, a parametric test die used at contact probe is non-testable, an outer ring, edge die is non-testable, assumed "bad" due to high defect rate, identification and alignment areas are non-testable, and an ugly die is non-testable, assumed "bad" as defined by a separate optical inspection process, AVI (Automated Visual Inspection, and a normal die is testable.

2. Once "non-testable" and "testable" areas are defined, the software divides all testable chips into twelve-chip grid cells each segment of the grid array being a 3×4-chip area. A single test chip sample is randomly selected from each segment, and the initial test list is generated. This sample size (8.3 percent) has been experimentally determined to provide a good balance between test confidence level (99.3 percent), and testing rate.

3. The GSP software passes the X, Y coordinates of the sample list to the prober, which tests all the selected chips. The test results are updated on the wafer map, and test results are recorded.

4. The sample data is then analyzed to determine if 100 percent test of the entire wafer is warranted. The decision is based on the defect rate of the sample, and is dependent on the device type. The GSP identifies effectively areas about the size of the twelve-chip grid area. Small, random defects are not reliably detected, but a defect rate can be estimated from statistical sampling. A minimum sample yield look-up table for each device type referenced, and the decision to sample or 100 percent probe each wafer is made based on the percent yield of the test sample.

5. If the sample yield falls below a predetermined cutoff point, GSP generates a 100 percent test list and probes the entire wafer. Extremely high defect rates will cause automatic scrap of the low yield wafer.

6. If the sample yield is acceptable to continue in the sample mode, GSP examines the tested sample failures. If a failure is encountered, the software enters a recursive test process known as "blob" analysis." In this mode, the address of each of the eight die adjacent to the failing chip are pushed onto a test list stack, excluding both non-testable areas and die that have already been tested. The prober is sequenced through the new test list, updating the wafer map with test results. The failure examination and sequencing process is repeated until the entire wafer is tested. By this method, the defective areas similar in size or larger than the sample grid area are traced out by a border of 100 percent tested good die (or non-testable areas). All grid segments untouched by "blob analysis", and having a good sample are assumed good, thus escaping test and reducing overall test cost. The initial sample, defect areas and good chips bordering the defect areas are the only locations that receive testing.

The present invention takes advantage of the GSP process with revision. Non-trim GSP only tracks pass or fail status to steer the probe sequence. The present invention provides a method of tracking whether or not a trim chip requires test or trim, and can distinguish between good, bad, trimmed, and untrimmed devices in the final wafer map.

What is claimed is:

1. A method of selective trim and wafer testing of precision trimmed integrated circuits comprising the steps of:

determining if each sample die of the wafer requires trimming or not and steering a sampling routine between 100 percent test and trim and sample test after determining if each die requires trimming or not.

2. A method of selective trim and wafer testing of precision trimmed integrated circuits comprising the steps of:

determining if each sample die requires trimming or not and steering a sampling routine between 100 percent test and trim and sample test, said steering step includes maintaining the test sequence in the sample test only testing mode until a trim or test failure occurs and if a trim or test failure occurs performing 100 percent test and trimming in a map sequence such that failures are traced along a boundary between passing and fail/trim devices.

3. A method of selective trim and wafer testing of precision trimmed integrated circuits comprising the steps of:

determining if each sample die requires trimming or not and steering a sampling routine between 100 percent test and trim and sample test, the step of determining if each die requires trimming includes the step of determining if the mean value of the pre-trim distribution be nominally centered between the desired minimum and maximum test limits.

4. A method of selective trim and wafer testing of precision trimmed integrated circuits comprising the steps of:

determining if a sample die is within the specification;

if the sample die is within the specification measuring the sample parameters and if the die passes the parameter measurements the die is good and continue repeating steps of determining if the next sample die is within specification and if so measuring the parameters and if the die passes the parameter measurements the die is good; and if the die fails the measurement, recording the failure in a record and reject the die; and if the die requires trimming, trimming the die and then measuring the parameters of the die to determine pass or fail and recording the trimmed die to said record to record the boundary between pass and fail/trim dies.

5. The method of claim 4 wherein if a trim or test failure occurs performing 100 percent test and trimming in a map sequence such that failures are traced along a boundary between passing and fail/trim devices.

6. The method of claim 4 wherein when a die is trimmed a flag is set to identify a need to trim.

7. The method of claim 4 wherein failure before and after die trimming is recorded.

* * * * *